United States Patent
Wu

(10) Patent No.: US 7,054,192 B2
(45) Date of Patent: May 30, 2006

(54) METHOD OF CONTROLLING THRESHOLD VOLTAGE OF NROM CELL

(75) Inventor: Chao I. Wu, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/788,857

(22) Filed: Feb. 26, 2004

(65) Prior Publication Data

US 2005/0190596 A1    Sep. 1, 2005

(51) Int. Cl.
*G11C 16/04* (2006.01)
(52) U.S. Cl. ............ 365/185.03; 365/200; 365/185.28; 257/183.1
(58) Field of Classification Search ........... 365/185.03, 365/200, 185.28; 257/183.1
See application file for complete search history.

(56) References Cited

U.S. PATENT DOCUMENTS

| | | | |
|---|---|---|---|
| 6,011,725 A | 1/2000 | Eitan | |
| 6,487,114 B1 | 11/2002 | Jong et al. | |
| 2003/0117861 A1* | 6/2003 | Maayan et al. | 365/200 |
| 2004/0017693 A1* | 1/2004 | Kuo et al. | 365/185.03 |
| 2004/0222437 A1* | 11/2004 | Avni et al. | 257/200 |

OTHER PUBLICATIONS

T. Y. Chen et al., "A True Single-Transistor Oxide-Nitride-Oxide EEPROM Device," IEEE Electron Device Letters, vol. EDL-8, No. 3, Mar. 1987, pp. 93–95.

* cited by examiner

*Primary Examiner*—Richard Elms
*Assistant Examiner*—N. Nguyen
(74) *Attorney, Agent, or Firm*—Martine Penilla & Gencarella LLP

(57) ABSTRACT

A method of two-sided asymmetric programming with a one-sided read for a Nitride Read Only Memory (NROM) cell with different quantity of stored charges uses the different interaction of the two bits to control the operation window of the threshold voltage. Due to the increase of the threshold voltage operation window of a NROM cell, four, eight, and sixteen memory states of a NROM cell can be achieved through the combination of the left bit, the right bit, the quantity of charge, and the charge position of its two bits.

26 Claims, 8 Drawing Sheets

METHOD OF CONTROLLING THRESHOLD VOLTAGE OF NROM CELL

BACKGROUND OF THE INVENTION

1. Field of the Invention

The present invention relates generally to a semiconductor memory cell, and more particularly to a method of controlling threshold voltages of a NROM cell for multiple level cell (MLC) operation.

2. Description of the Related Art

Nitride Read Only Memory (NROM) cells are currently widely used in semiconductor industry. FIG. 1 illustrates a cross-sectional view of a conventional NROM cell with two bits storage capability. The NROM cell 100 includes a substrate 110 with doped source 112 and drain 114. A silicon nitride layer 116 is sandwiched between two silicon oxide layers 118 and 120 disposed over the substrate 110. A gate conductor 122 is disposed over the silicon oxide layer 120, and a channel 115 is formed under the silicon oxide layer 118 between drain 114 and source 112.

A NROM cell can be electrically programmed, read, and erased. The programming of the NROM cell 100 generates hot electrons in the channel 1115. A fraction of these hot electrons gain enough energy to surmount the barrier of the silicon oxide layer 118 and become trapped on the silicon nitride layer 116. The trapped charge will move to the region in the layer 116 near drain 114. Since the silicon nitride layer 116 is non-conductive, the NROM cell 100 can be programmed to have hot charges gathered at both ends of the layer 116: the right end near drain 114 with a stored charge 124 and the left end near source 112 with a stored charge 126.

When a NROM cell is read, the presence or absence of stored charge is determined by sensing the change in its threshold voltages. If a NROM cell is charged or programmed, its threshold voltage increases. The presence of stored charge is interpreted as the logical information signal "0"; the absence of stored charge is interpreted as the logical information signal "1". As shown in FIG. 1, the NROM cell 100 has stored charges on both sides; therefore, the logical information signals for both bits of the NROM cell 100 are "0" and "0".

A NROM cell capable of multiple levels of charges is said to have multiple level cell (MLC) operation capability. Different levels of charge results in different threshold voltages. The more the charge for a NROM cell, the higher its threshold voltage. The use of NROM cells with MLC operation capability leads to reduce the volume occupied by memory cells and produce dense semiconductor structures.

Conventional symmetrical programming and reading provides a method of a one-sided programming, reading, and erasing for a NROM cell. However, in order to achieve multiple threshold voltages, this method needs multiple program conditions.

U.S. Pat. No. 6,011,725 to Eitan discloses a method of asymmetrical programming, reading and erasing for a NROM cell with two bits storage capability. This invention suffers from the drawback that the void of interaction between the two bits of a NROM cell, due to the reverse read method, limits the threshold voltage operation window.

U.S. Pat. No. 6,487,114 B2 to Jong et al. discloses a method of simultaneously reading two bits of information for a NROM cell. Unfortunately, this method can read only up to four memory states for a two-bit NROM cell.

In view of the foregoing, there is a need for a method of controlling the threshold voltage of a NROM cell for MLC operation so that fewer programming conditions are needed to form multiple memory states.

SUMMARY OF THE INVENTION

Broadly speaking, the present invention fills this need by providing a method of two-sided asymmetric programming with a one-sided read for a Nitride Read Only Memory (NROM) cell with different quantity of charge when an interaction between the right bit and the left bit exists. The two-sided programming makes a NROM cell require less programming conditions to form multiple memory states, as compared with the one-sided programming method; the one-sided read enables a NROM cell to perform MLC operation not only at the non-interaction region of the two bits, but also at the interaction region of the two bits. Since the threshold voltage of a NROM cell at the interaction region is higher than the threshold voltage of a NROM cell at the non-interaction region, the threshold voltage of the NROM cell is increased. Thus, the operation window of the threshold voltage is controlled. Furthermore, four, eight, and sixteen memory states of a NROM cell can be achieved through the combination of the left bit, the right bit, the quantity of charge, and the charge position as a result of the increase of the threshold voltage.

In accordance with one aspect of the present invention, one embodiment shows a method of two-sided asymmetric programming with a one-sided read for a NROM cell with different quantity of charges. This embodiment also uses a graph to illustrate the different interaction regions of the two bits for the NROM cell while it is programmed. When the charges of the two bits are low, there is no interaction between the two bits. As the charges of the two bits get higher, there exists an interaction between the two bits such that the charge of one bit affects the charge of the other bit. The method of two-sided asymmetric programming with a one-side read can perform the MLC operation for a NROM cell at both the interaction region and the non-interaction region. As a result, the threshold voltage of the NROM cell is not limited to the low threshold voltage range where no interaction exists between the two bits.

In accordance with another embodiment, one of the advantages of the present invention, i.e., low read voltages for a NROM cell can be achieved. A low read voltage can ease the read disturb for a NROM cell. It is also noted that because it is not an objective to discriminate memory state between the two bits, it is possible to use a smaller read voltage to sense the integrated memory state from the two bits. More specifically, in accordance with the invention, it is possible to use the interaction between the two bits to define the memory states, and as a result, it is possible to use smaller read voltages.

In yet another embodiment, a NROM cell is shown with different quantity of charge at four different charge states by using the two-sided asymmetric programming with a one-sided read method through the combination of the right bit, the left bit, the quantity of charge, and the charge position for those two bits. It also uses a graph to show the threshold voltages of the NROM cell as a function of the read voltages.

In still another embodiment, a NROM cell is capable of showing eight different charge states, due to the increase of the threshold voltages, by using the two-sided asymmetric programming with a one-sided read method through the combination of the right bit, the left bit, the quantity of charge, and the charge position for those two bits.

In yet another embodiment, a NROM cell is capable of showing sixteen different charge states, due to the increase of the threshold voltages, by using the two-sided asymmetric programming with a one-sided read method through the combination of the right bit, the left bit, the quantity of charge, and the charge position for those two bits.

Other aspects and advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE EXEMPLARY EMBODIMENTS

Reference is made in detail to embodiments of the invention. While the invention is described in conjunction with the embodiments, the invention is not intended to be limited by these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
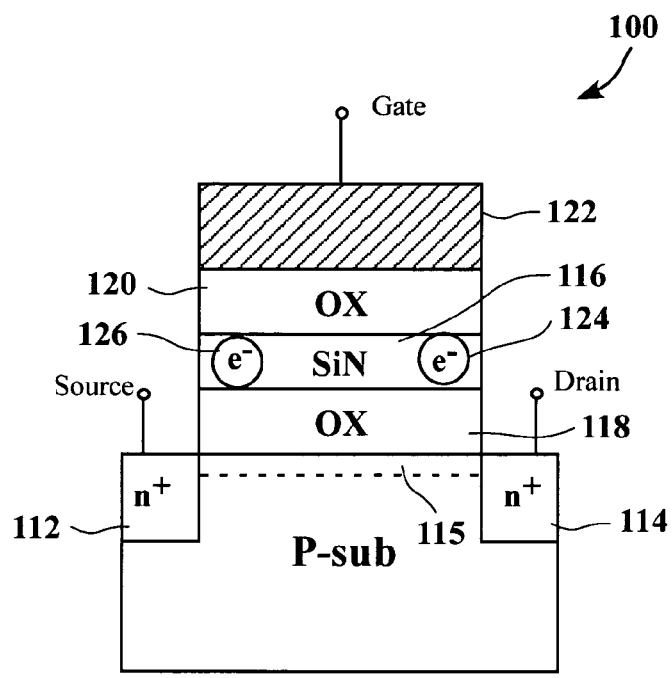
FIG. 1 illustrates a cross-sectional view of a Nitride Read Only Memory (NROM) cell with equal level of charges at its right bit and left bit.
Figure 2:
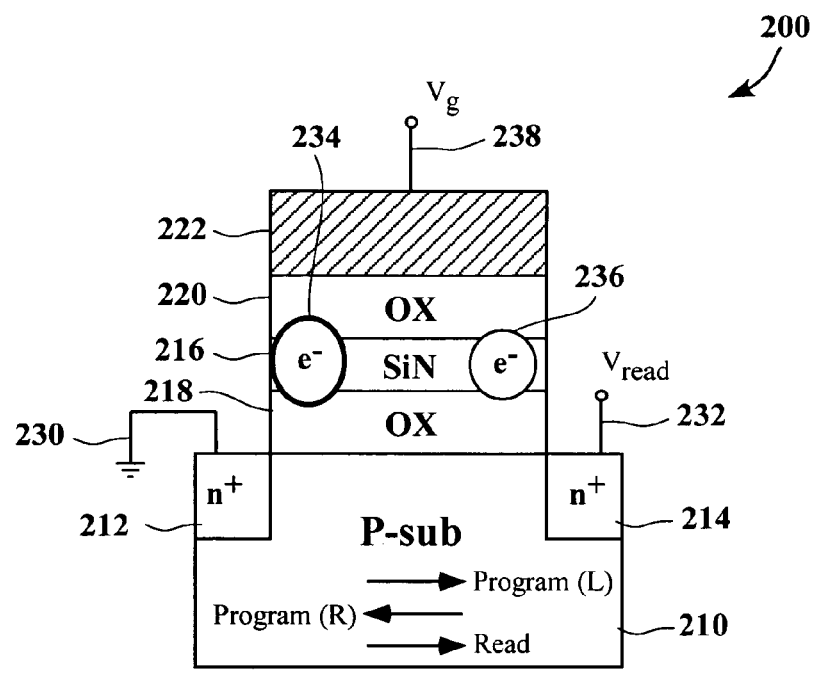
FIG. 2 illustrates a cross-sectional view of a NROM cell with different quantity of charge at its right bit and left bit in accordance with one embodiment of the present invention.

Referring first to FIG. 2, a cross-sectional view of a Nitride Read Only Memory (NROM) cell 200 is shown illustrating different charge levels at the right bit and the left bit of the NROM cell 200 in accordance with one embodiment of the present invention. The illustrated NROM cell 200 has semiconductor substrate 210 with doped source 212 and drain 214. A silicon nitride layer 216 is sandwiched between two silicon oxide layers 218 and 220 disposed over the substrate 210. A gate conductor 222 is disposed over the silicon oxide layer 220.

The illustrated NROM cell 200 is programmed using two-sided asymmetric programming with a one-sided read. When the right bit of the NROM cell 200 is programmed, a drain voltage and a gate voltage are applied to the terminal 232 and the gate terminal 238, respectively, and the terminal 230 is grounded. While the left bit of the NROM cell 200 is programmed, a drain voltage and a gate voltage are applied to the terminal 230 and the gate terminal 238, respectively, and the terminal 232 is grounded. The NROM cell 200 is programmed with different levels of charges for its two bits: the left bit with a high charge 234 and the right bit with a low charge 236. In order to achieve a high charge 234 at the left bit, a higher gate voltage Vg at the gate terminal 238 or a higher drain voltage at the terminal 230 are needed relative to the gate voltage or the drain voltage for programming the right bit with a low charge 236. Another way to achieve a higher charge at one bit is to spend more programming time relative to the time spent for the other bit that has a lower charge.

The illustrated NROM cell 200 is only read from a single side, in this embodiment of the present invention, the terminal 232. When performing the read operation for the NROM cell 200, a read voltage Vread and a gate voltage Vg are applied to the terminal 232 and the gate terminal 238, respectively, and the terminal 230 is grounded.

Figure 3:
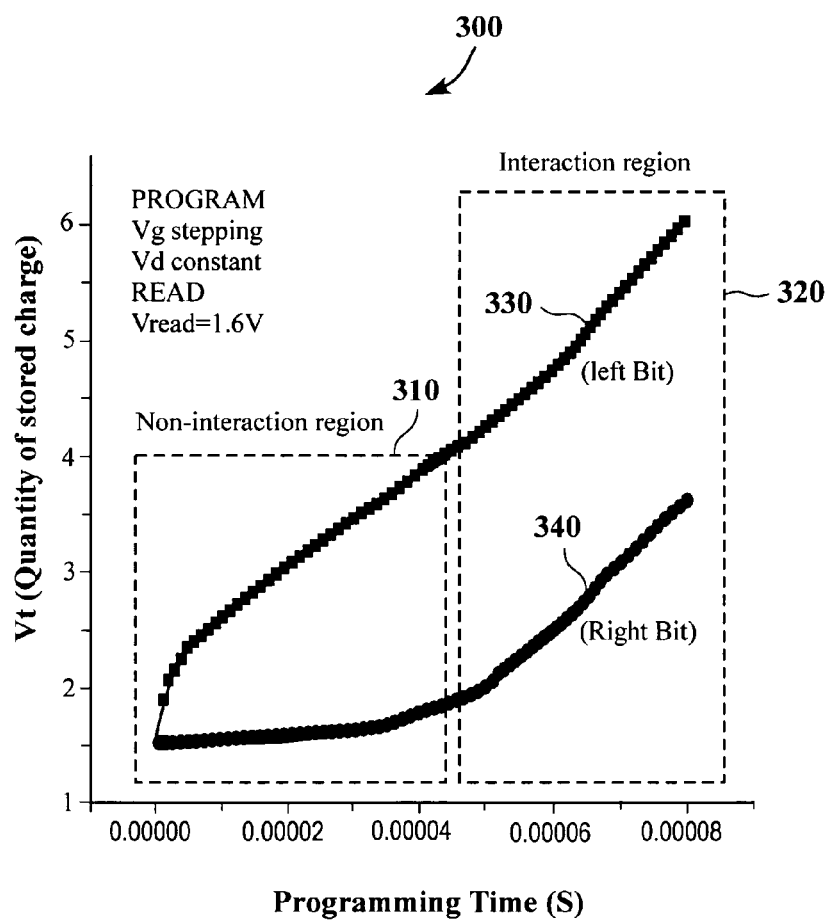
FIG. 3 is a graph showing the quantity of stored charge as a function of the programming time for a NROM cell in accordance with the embodiment of FIG. 2.

Referring now to FIG. 3 in view of FIG. 2, a graph 300 is shown illustrating the quantity of stored charge at the left bit and the right bit of the NROM cell 200 as a function of the programming time in accordance with the embodiment of FIG. 2. The left bit charge profile 330 and the right bit charge profile 340 are divided into two regions: the interaction region 320 and the non-interaction region 310.

As shown in graph 300, the different quantity of stored charge will cause different interaction between the two bits of the NROM cell 200. At the beginning of the left bit programming operation, the quantities of charges for both bits are low. As indicated by the non-interaction region 310, the increase of the stored charge at the left bit has no or little effect for the stored charge at the right bit. As the programming time increases, when the quantity of the stored charge for the left bit is high enough to reach into the interaction region 320, there exists an interaction between the left bit and the right bit. The interaction between those two bits has such an effect that the increase of the stored charge for the left bit will induce an increase of the stored charge for the right bit. A higher quantity of stored charge for the left bit can be achieved from either self-programming or the interaction of the right bit when the right bit is programmed.

The described method of two-sided asymmetric programming with a one-sided read makes the NROM cell 200 with different level of charges capable of operating at both the non-interaction region 310 and the interaction region 320. As indicated in graph 300, the threshold voltage of the NROM cell 200 is higher in the interaction region than in the non-interaction region. As a result, the threshold voltage operation window of the NROM cell 200 is expanded and is not limited by the non-interaction region.

Figure 4:
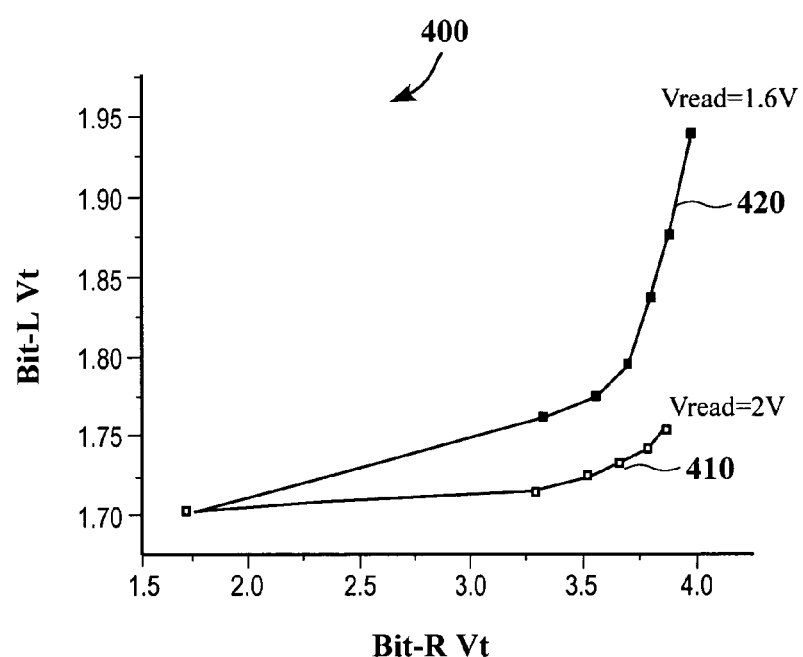
FIG. 4 is a graph showing the effect of the stored charges for the left bit and the right bit of a NROM cell when different read voltages are applied in accordance with one embodiment of the present invention.

Referring now to FIG. 4, a graph 400 is shown illustrating the effect of the stored charge for the left bit and the right bit of a NROM cell when different read voltages are applied in accordance with one embodiment of the present invention.

During a reverse read operation of a NROM cell, a high interaction between the two bits should be avoided because the high interaction leads to decreased read sense margin. As shown in the stored charge profile 420, a low read voltage, 1.6V, will cause a high interaction between the two bits of a NROM cell. On the contrary, a high read voltage, for example, 2V, as shown from the stored charge profile 410, leads to a low interaction between the two bits of a NROM cell. Although a higher read voltage is desired in order to reduce the interaction between the two bits during the reverse read operation of a NROM cell, a higher read voltage may cause read disturbs. Because the present invention uses the one-sided read method instead of the reverse read method, it will not face the limitation of the interaction of the two bits. More specifically, the present invention uses the interaction to define the memory states; therefore, a lower read voltage can be used to sense the integrated memory states from the two bits. The read voltage for a NROM cell in the present invention can be as low as about 1V.

Figure 5A:
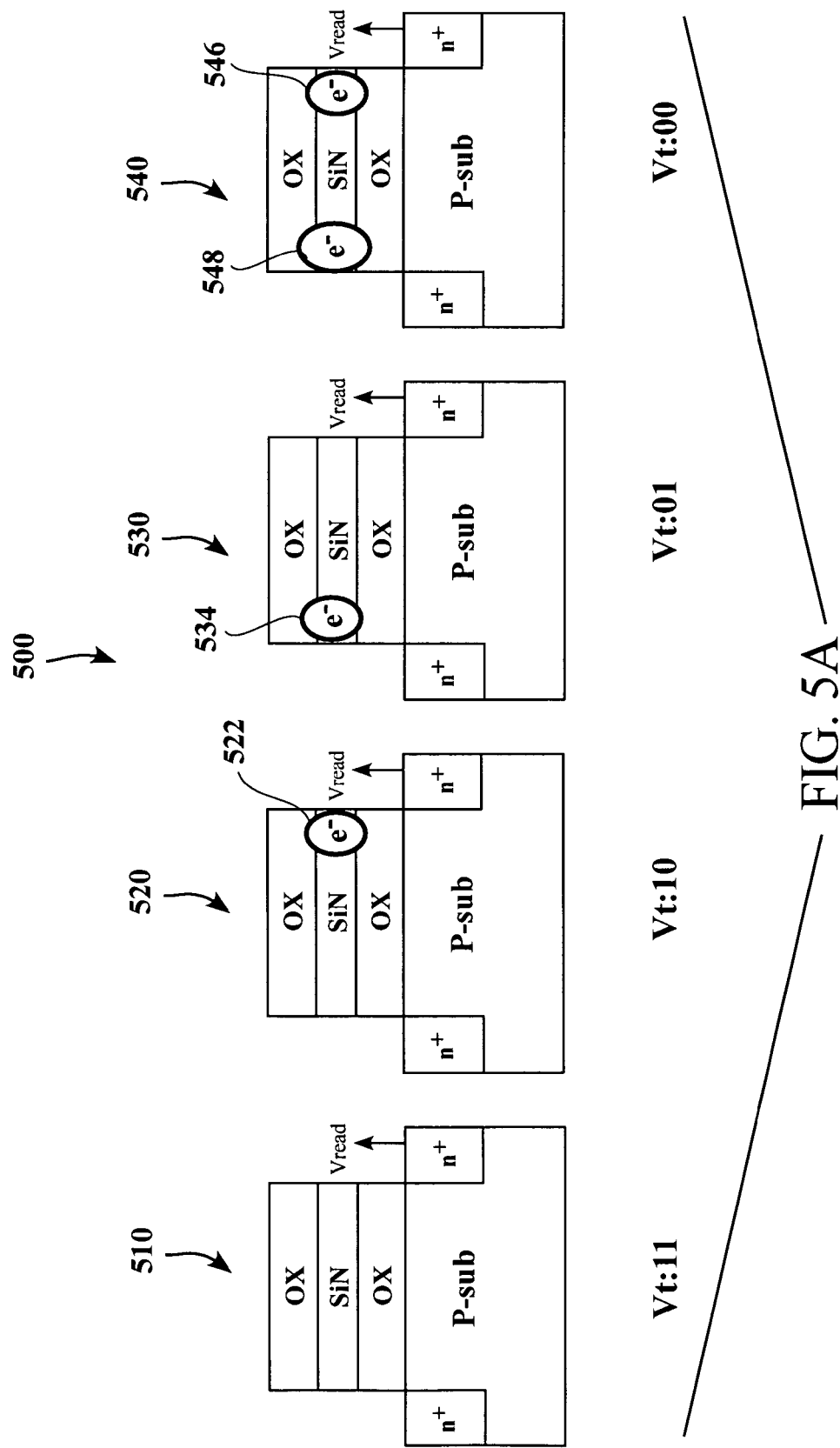
FIG. 5A illustrates cross-sectional views of a NROM cell with four different charge states in accordance with one embodiment of the present invention.
Figure 5B:
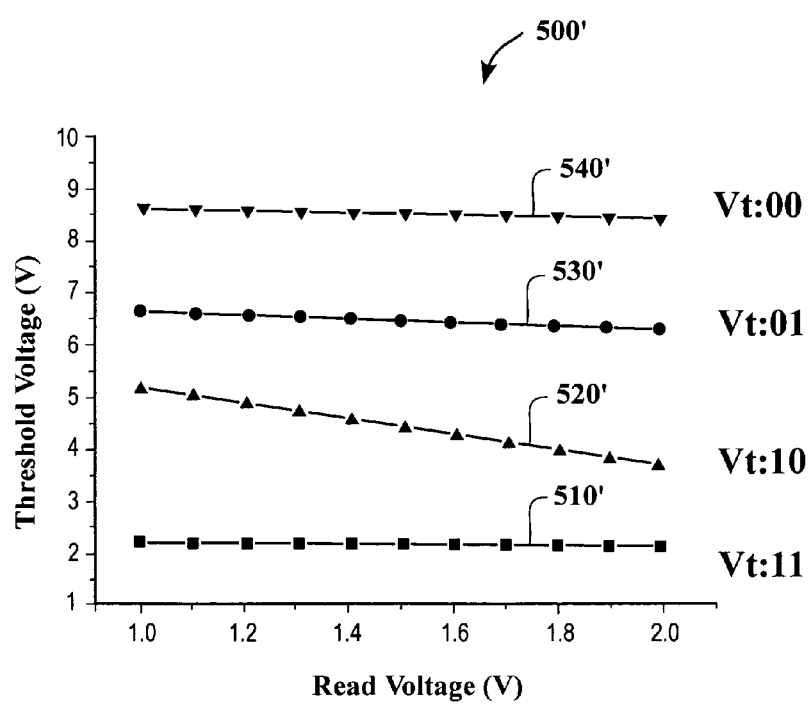
FIG. 5B is a graph showing the threshold voltage as a function of the read voltage for a NROM cell with four different charge states in accordance with the embodiment of FIG. 5A.

Referring now to FIG. 5A and FIG. 5B, a NROM cell 500 with four different charge states and the corresponding threshold voltage profiles are shown in accordance with one embodiment of the present invention. FIG. 5A illustrates four cross-sectional views of a NROM cell 500 with four different charge states. The illustrated NROM cell 500 is programmed by using the method of two-sided asymmetric programming with a one-sided read. As shown in FIG. 5A, the read operation of the illustrated NROM cell 500 is only performed from the right side. FIG. 5B shows the corresponding threshold voltage as a function of the read voltage for the NROM cell 500 with four different charge states in accordance with the embodiment of the FIG. 5A. The graph 500' in FIG. 5B shows that the read voltage can be set as low as 1V in order to reduce the read disturb. Of course, the operation window can be controlled by optimizing the quantity of charge at the right bit and the left bit.

In FIG. 5A, the cross-sectional view 510 shows the NROM cell 500 without any charges for its two bits. As a result, the initial threshold voltage is low (about 2V), as shown in the threshold voltage profile 510' of FIG. 5B. The cross-sectional view 520 shows the NROM cell 500 with a low charge 522 at its right bit, i.e., its read-side. The low charge 522 is about 6.5V. According to local drain-induced barrier lowering (DIBL) effect, the threshold voltage of the stored low charge 522 at the read-side will be reduced to about 4.5V, as illustrated in the threshold voltage profile 520' of FIG. 5B. The cross-sectional view 530 shows the NROM cell 500 with a low charge 534 (about 6.5V) at its left bit. Because the low charge 534 is stored at the left side, no local DIBL effect exists while reading the NROM cell 500 from the right side. Thus, the corresponding threshold voltage is about 6.5V, as indicated in the threshold voltage profile 530' of FIG. 5B. Finally, the cross-sectional view 540 shows the NROM cell 500 with a low charge 546 at its right bit and a high charge 548 at its left bit. The low charge 546 is about 6.5V and the high charge 548 should be higher than 6.5V. Because the interaction between the right bit and the left bit, a higher threshold voltage is achieved. As shown in the threshold voltage profile 540', the corresponding threshold voltage is about 8.5V.

Figure 6:
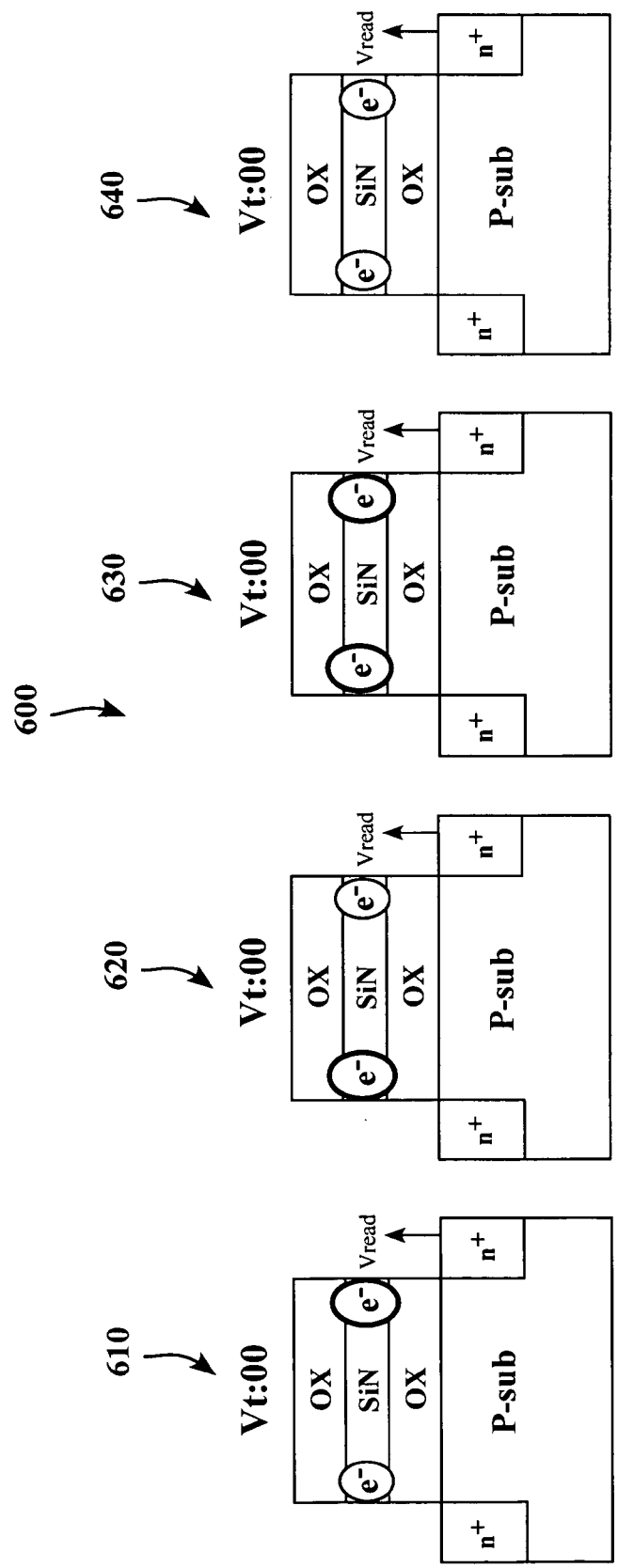
FIG. 6 illustrates cross-sectional views of a NROM cell with different quantity of charge when both sides of the NROM cell are programmed in accordance with one embodiment of the present invention.

Referring now to FIG. 6, four cross-sectional views of a NROM cell 600 is shown illustrating four possible programming arrangements when both sides of the NROM cell 600 are programmed in accordance with one embodiment of the present invention.

The NROM cell 600 can be programmed with a low charge at its left side and a high charge at its right side, as shown in the first cross-sectional view 610 from the left side. The next cross-sectional view of 620 has a high charge at its left side and a low charge at its right side. The cross-sectional view 630 of the NROM cell 600 illustrates a case where both charges are low, and the cross-sectional view of 640 illustrates a case where both charges are high. In either case, the examples of FIG. 6 show how many combinations can be made when both sides of the NROM cell 600 is programmed. Accordingly, if only one side of a NROM cell is programmed, the stored charge can be either low or high. Through the combination of the right bit, the left bit, the quantity of charge, and the charge position, 16 possible charge states for a particular NROM cell can be achieved due to the increase of the threshold voltage by using the two-sided asymmetric programming with a one-sided read method.

Figure 7:
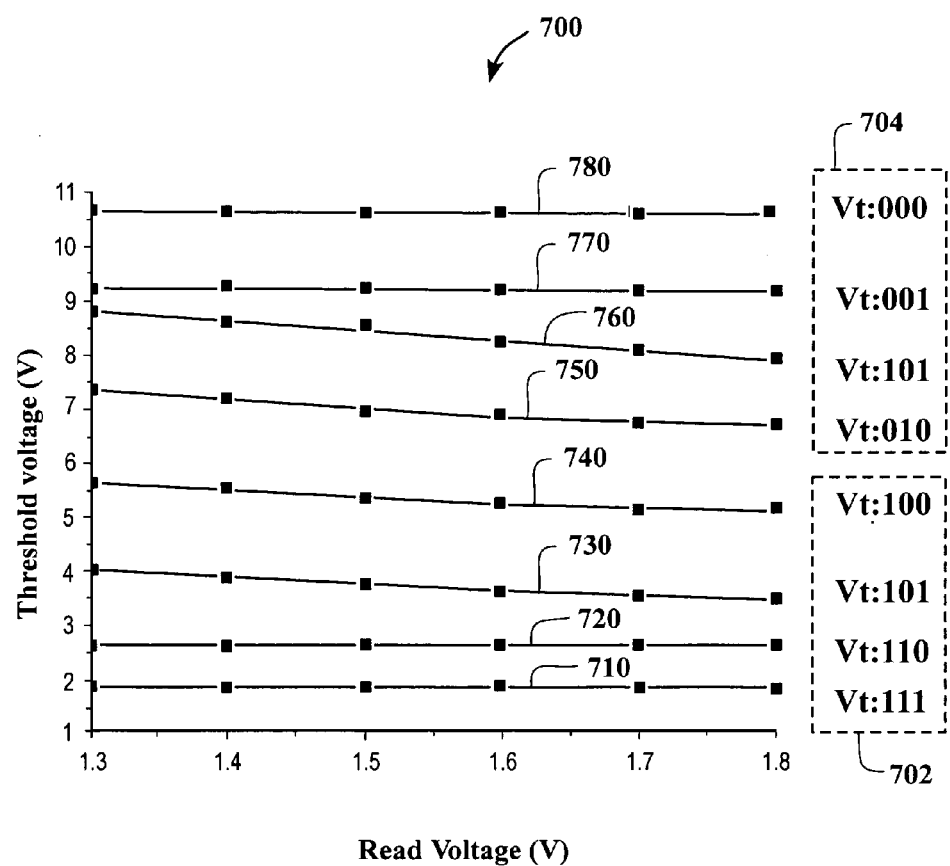
FIG. 7 is a graph showing the threshold voltage as a function of the read voltage for a NROM cell with eight different charge states in accordance with one embodiment of the present invention.

Referring now to FIG. 7, a graph 700 is shown illustrating the threshold voltage Vt as a function of the read voltage for a NROM cell with eight different charge states in accordance with one embodiment of the present invention. The graph 700 is achieved by using the method of two-sided asymmetric programming with a right-sided read through the combination of the right bit, the left bit, the quantity of charge, and the charge position.

The threshold voltage profile 710 shows the threshold voltage as a function of the read voltage for a NROM cell and no charges exists at both bits (Vt is about 2V). The threshold voltage profile 720 shows the threshold voltage as a function of the read voltage for a NROM cell, and a low charge exists for the left bit (Vt is about 2.6V). The threshold voltage profile 730 shows the threshold voltage as a function of the read voltage for a NROM cell and a low charge exists for the right bit (Vt is about 3.9V). The threshold voltage profile 740 shows the threshold voltage as a function of the read voltage for a NROM cell and a low charge exists for the left bit (Vt is about 5.5V). The threshold voltage profile 750 shows the threshold voltage as a function of the read voltage for a NROM cell and a high charge exists for the right bit (Vt is about 7V). The threshold voltage profile 760 shows the threshold voltage as a function of the read voltage for a NROM cell and a high charge exists for the right bit (Vt is about 8.4V). The threshold voltage profile 770 shows the threshold voltage as a function of the read voltage for a NROM cell and a high charge exists for the left bit (Vt is about 9.2V). The threshold voltage profile 780 shows the threshold voltage as a function of the read voltage for a NROM cell and a high charge exists for the left bit (Vt is about 10.6V).

The threshold voltage profiles 710, 720, 730 and 740 show the threshold voltages as a function of the read voltages for a NROM cell with four different low charge states. The low charges used to obtain the threshold voltage profiles 710, 720, 730 and 740 could be different low charge values. The threshold voltage profiles 750, 760, 770 and 780 show the threshold voltages as a function of the read voltages for a NROM cell with four different high charge states. The high charges used to obtain the threshold voltage profiles 750, 760, 770 and 780 could be different high charge values. When the charges of a NROM cell are low, the left most bit of the logical information signal is "1", as indicated in the low charge logical information signal region 702. When the charges of a NROM cell are high, the left most bit of the logical information signal is "0", as shown in the high charge logical information signal region 704. Thus, due to the increase of the threshold voltage operation window, the combination of the left bit, the right bit, the quantity of charge, and the charge position makes a two-bit NROM cell capable of showing eight different charge states.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modification s according to the particular purpose contemplated. The scope of the invention is intended to be defined by the claims appended hereto and their equivalents.

The invention claimed is:

1. A method for operating a memory cell that is capable of storing multiple levels of charge, comprising:
    programming the memory cell from each of a right side and a left side, the right side capable of storing a right bit and the left side capable of storing a left bit, a quantity of charge used in the programming of the memory cell setting when interaction between the right bit and the left bit is to exist, wherein the interaction between the right bit and the left bit exists when a higher charge is stored in the memory cell relative to lower charges that do not cause interaction between the right bit and the left bit; and
    reading a charge level of the memory cell from a single side of the memory cell.

2. The method for operating a memory cell that is capable of storing multiple levels of charge as recited in claim 1, wherein reading the charge level from the single side limits reading from one side of the memory cell to enable identification of the charge level.

3. The method for operating a memory cell that is capable of storing multiple levels of charge as recited in claim 1, wherein the reading enables identification of the charge level when a read voltage is applied to a diffusion terminal of the single side of the memory cell and a ground voltage is applied to a diffusion terminal of the opposite side of the single side.

4. The method for operating a memory cell that is capable of storing multiple levels of charge as recited in claim 3, wherein the read voltage is maintained below 2 volts.

5. The method for operating a memory cell that is capable of storing multiple levels of charge as recited in claim 1, wherein four, eight, and sixteen memory states of the memory cell can be achieved through the combination of the right bit, the left bit, the quantity of charge, and the charge position.

6. The method for operating a memory cell that is capable of storing multiple levels of charge as recited in claim 1, wherein increased programmed charge in the left bit causes the interaction between the right bit and the left bit, such that the right bit is induced to increase in correlation with increases in the programmed charge in the left bit.

7. The method for operating a memory cell that is capable of storing multiple levels of charge as recited in claim 1, wherein higher threshold voltages of the memory cell can be achieved when the interaction between the right bit and the left bit of the memory cell exists relative to lower threshold voltages of the memory cell when no interaction between the right bit and the left bit of the memory cell exists.

8. The method for operating a memory cell that is capable of storing multiple levels of charge as recited in claim 1, wherein the memory cell is a charge trapping device.

9. A method for operating a memory cell that is capable of storing multiple levels of charge, comprising:
    programming the memory cell from each of a first side and a second side, the first side capable of storing a first bit and the second side capable of storing a second bit, a quantity of charge used in the programming of the memory cell setting when interaction between the first bit and the second bit exists, wherein the interaction between the first bit and the second bit exists when a higher charge is stored in the memory cell relative to lower charge that do not cause interaction between the first bit and the second bit; and
    reading a charge level of the memory cell from a single side of the memory cell.

10. The method for operating a memory cell that is capable of storing multiple levels of charge as recited in claim 9, wherein the first side is a right side and the first bit is a right bit, and the second side is a left side and a second bit is a left bit.

11. The method for operating a memory cell that is capable of storing multiple levels of charge as recited in claim 10, wherein reading the charge level from the single side limits reading from one side of the memory cell to enable identification of the charge level.

12. The method for operating a memory cell that is capable of storing multiple levels of charge as recited in claim 10, wherein the reading enables identification of the charge level when a read voltage is applied to a diffusion terminal of the single side of the memory cell and a ground voltage is applied to a diffusion terminal of the opposite side of the single side.

13. The method for operating a memory cell that is capable of storing multiple levels of charge as recited in claim 12, wherein the read voltage is maintained below 2 volts.

14. The method for operating a memory cell that is capable of storing multiple levels of charge as recited in claim 9, wherein four, eight, and sixteen memory states of the memory cell can be achieved through the combination of the right bit, the left bit, the quantity of charge, and the charge position.

15. The method for operating a memory cell that is capable of storing multiple levels of charge as recited in claim 10, wherein increased programmed charge in the right bit causes the interaction between the right bit and the left bit, such that the left bit is induced to increase in correlation with increases in the programmed charge in the right bit.

16. The method for operating a memory cell that is capable of storing multiple levels of charge as recited in claim 10, wherein higher threshold voltages of the memory cell can be achieved when the interaction between the right bit and the left bit of the memory cell exists relative to lower threshold voltages of the memory cell when no interaction between the right bit and the left bit of the memory cell exists.

17. The method for operating a memory cell that is capable of storing multiple levels of charge as recited in claim 10, wherein the memory cell is a charge trapping device.

18. The method for operating a memory cell that is capable of storing multiple levels of charge as recited in claim 10, wherein the first side is a left side and the first bit is a left bit, and the second side is a right side and a second bit is a right bit.

19. The method for operating a memory cell that is capable of storing multiple levels of charge as recited in claim 18, wherein reading the charge level from the single side limits reading from one side of the memory cell to enable identification of the charge level.

20. The method for operating a memory cell that is capable of storing multiple levels of charge as recited in claim 18, wherein the reading enables identification of the charge level when a read voltage is applied to a diffusion terminal of the single side of the memory cell and a ground voltage is applied to a diffusion terminal of the opposite side of the single side.

21. The method for operating a memory cell that is capable of storing multiple levels of charge as recited in claim 20, wherein the read voltage is maintained below 2 volts.

22. The method for operating a memory cell that is capable of storing multiple levels of charge as recited in claim 18, wherein the interaction between the right bit and the left bit exists when a higher charge is stored in the memory cell relative to lower charge that do not cause interaction between the right bit and the left bit.

23. The method for operating a memory cell that is capable of storing multiple levels of charge as recited in claim 22, wherein four, eight, and sixteen memory states of the memory cell can be achieved through the combination of the right bit, the left bit, the quantity of charge, and the charge position.

24. The method for operating a memory cell that is capable of storing multiple levels of charge as recited in claim 18, wherein increased programmed charge in the right bit causes the interaction between the right bit and the left bit, such that the left bit is induced to increase in correlation with increases in the programmed charge in the right bit.

25. The method for operating a memory cell that is capable of storing multiple levels of charge as recited in claim 18, wherein higher threshold voltages of the memory cell can be achieved when the interaction between the right bit and the left bit of the memory cell exists relative to lower threshold voltages of the memory cell when no interaction between the right bit and the left bit of the memory cell exists.

26. The method for operating a memory cell that is capable of storing multiple levels of charge as recited in claim 18, wherein the memory cell is a charge trapping device.

* * * * *